US009362342B2

(12) United States Patent
Ono et al.

(10) Patent No.: US 9,362,342 B2
(45) Date of Patent: Jun. 7, 2016

(54) LIGHT-EMITTING ELEMENT DISPLAY DEVICE

(71) Applicant: Japan Display Inc., Tokyo (JP)

(72) Inventors: Keisuke Ono, Tokyo (JP); Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/339,484

(22) Filed: Jul. 24, 2014

(65) Prior Publication Data

US 2015/0028309 A1 Jan. 29, 2015

(30) Foreign Application Priority Data

Jul. 26, 2013 (JP) ................................. 2013-155370

(51) Int. Cl.
*H01L 29/08* (2006.01)
*H01L 27/32* (2006.01)
*F21V 9/10* (2006.01)

(52) U.S. Cl.
CPC .............. *H01L 27/3211* (2013.01); *F21V 9/10* (2013.01); *H01L 27/322* (2013.01); *H01L 27/3213* (2013.01); *H01L 27/3246* (2013.01)

(58) Field of Classification Search
CPC . H01L 27/32; H01L 27/3211; H01L 27/3248; H01L 51/5275; H01L 51/5271; H01L 51/5209; H01L 51/52
USPC .............. 438/29, 30, 149, 153, 154; 257/347, 257/351; 349/139–152; 313/500
See application file for complete search history.

(56) References Cited

U.S. PATENT DOCUMENTS

| 2006/0231830 | A1* | 10/2006 | Matsuda | ............... | H01L 51/001 257/40 |
| 2008/0042146 | A1* | 2/2008 | Cok | ...................... | H01L 27/322 257/79 |
| 2011/0127505 | A1* | 6/2011 | Nakamura | .......... | H01L 51/5088 257/40 |
| 2011/0248247 | A1* | 10/2011 | Matsumoto | ............ | C09K 11/06 257/40 |
| 2012/0038829 | A1* | 2/2012 | Mitani | ..................... | G09G 3/28 348/649 |
| 2012/0061653 | A1* | 3/2012 | Yamazaki | ........... | H01L 27/3209 257/40 |

FOREIGN PATENT DOCUMENTS

JP 2006-339028 A 12/2006

* cited by examiner

*Primary Examiner* — Tuan Nguyen
(74) *Attorney, Agent, or Firm* — Typha IP LLC

(57) ABSTRACT

A light-emitting element display device includes: a thin film transistor substrate including transistors respectively controlling the amounts of light emission of a plurality of sub-pixels arranged in a display region; and a color filter substrate arranged to overlap with the thin film transistor substrate. The thin film transistor substrate includes a light-emitting organic layer covering the entire display region and emitting light in respective light-emitting regions in the plurality of sub-pixels, an insulating bank formed of an insulating material around each of the light-emitting regions, including an inclined surface being closer to the color filter substrate according to increasing in thickness with increasing distance from the light-emitting region, and a fluorescent layer formed on the inclined surface and excited by light of the light-emitting region to thereby emit light.

4 Claims, 8 Drawing Sheets

LIGHT-EMITTING ELEMENT DISPLAY DEVICE

CROSS-REFERENCE TO RELATED APPLICATION

The present application claims priority from Japanese application JP2013-155370 filed on Jul. 26, 2013, the content of which is hereby incorporated by reference into this application.

BACKGROUND OF THE INVENTION

1. Field of the Invention

The present invention relates to a light-emitting element display device, and more particularly to a light-emitting element display device that performs display by causing a light-emitting element as a self-luminous body arranged in each pixel to emit light.

2. Description of the Related Art

In recent years, an image display device using a self-luminous body called an organic light-emitting diode (OLED) has been put to practical use, hereinafter the image display device is called "organic EL (electro-luminescent) display device". Since the self-luminous body is used, the organic EL display device is superior in terms of visibility and response speed compared to a related-art liquid crystal display device, and in addition, a further reduction in thickness is possible in the organic EL display device because an auxiliary lighting device such as a backlight is not necessary.

For color display in such an organic EL display device, the following two kinds of methods are mainly used: one is to provide light-emitting elements that respectively emit lights of three colors of R (red), G (green), and B (blue) in respective pixels; and the other is to emit white light in a light-emitting element and allow lights in respective wavelength ranges of three colors of R, G, and B to transmit through color filters of respective pixels. For emitting white light, a method called "tandem" has been known in which white light is emitted by overlapping light-emitting elements of two colors (for example, yellow and blue) with each other in different layers and causing the light-emitting elements to emit both lights.

JP 2006-339028 A discloses that R (red), G (green), and B (blue) color filters are successively formed by patterning on a substrate on which an organic EL element is formed, and also discloses a configuration in which a color filter substrate on which color filters are formed in respective pixels is overlapped with a thin film transistor (TFT) substrate on which an organic EL element is formed.

SUMMARY OF THE INVENTION

In a light-emitting element display device such as an organic EL display device, light in a direction perpendicular to a substrate surface, in light emitted by a light-emitting element, is extracted, but lateral light cannot be effectively utilized in many cases. Moreover, the lateral light may be mixed with light emitted from other pixels, leading to a risk of reducing display quality.

On the other hand, the light-emitting layer of the light-emitting element display device is generally formed by a deposition process, which is inferior to a photolithography process in accuracy. Especially in a light-emitting element display device of a type in which lights of respective single colors of R, G, and B are emitted, dedicated deposition mask and deposition process are needed for respective three colors of R, G, and B in a deposition process. Therefore, a distance is needed between pixels (to be exact, between sub-pixels of R, G, and B), so that higher definition is difficult and the luminous efficiency tends to decrease as the aperture ratio decreases. Moreover, when a light-emitting layer is formed on the entire surface of a display region and light of white color or the like is extracted, since the same white light-emitting layer is formed on the entire surface, it is difficult to make a design such that the optical distances of direct light and reflected light are adjusted for respective colors of R, G, and B to produce a cavity effect.

The invention has been made in view of the circumstances described above, and it is an object of the invention to provide a light-emitting element display device that can effectively utilize lateral light and make use of a cavity effect, and has high luminous efficiency.

A light-emitting element display device according to an aspect of the invention includes: a thin film transistor substrate including transistors respectively controlling the amounts of light emission of a plurality of sub-pixels arranged in a display region; and a color filter substrate arranged to overlap with the thin film transistor substrate and including a color filter allowing light in a predetermined wavelength range to pass therethrough in at least one of the plurality of sub-pixels, wherein the thin film transistor substrate includes a light-emitting organic layer covering the entire display region and emitting light in respective light-emitting regions in the plurality of sub-pixels, an insulating bank formed of an insulating material around each of the light-emitting regions, including an inclined surface being closer to the color filter substrate according to increasing in thickness with increasing distance from the light-emitting region, and a fluorescent layer formed on the inclined surface and excited by light of the light-emitting region to thereby emit light.

In the light-emitting element display device according to the aspect of the invention, the light-emitting organic layer may emit light in a blue wavelength range, and the fluorescent layer may emit light in a yellow wavelength range.

In the light-emitting element display device according to the aspect of the invention, the color filter substrate may include a transmitting region transmitting light in a wavelength range emitted in the thin film transistor substrate.

In the light-emitting element display device according to the aspect of the invention, the plurality of sub-pixels may be sub-pixels emitting lights corresponding to R (red), G (green), B (blue), and W (white) wavelength ranges, the fluorescent layer may be formed only on the inclined surface around the light-emitting region of each of the sub-pixels corresponding to R, G, and W, and the transmitting region of the color filter substrate may be formed in the sub-pixels corresponding to B and W.

DETAILED DESCRIPTION OF THE INVENTION

Figure 1:
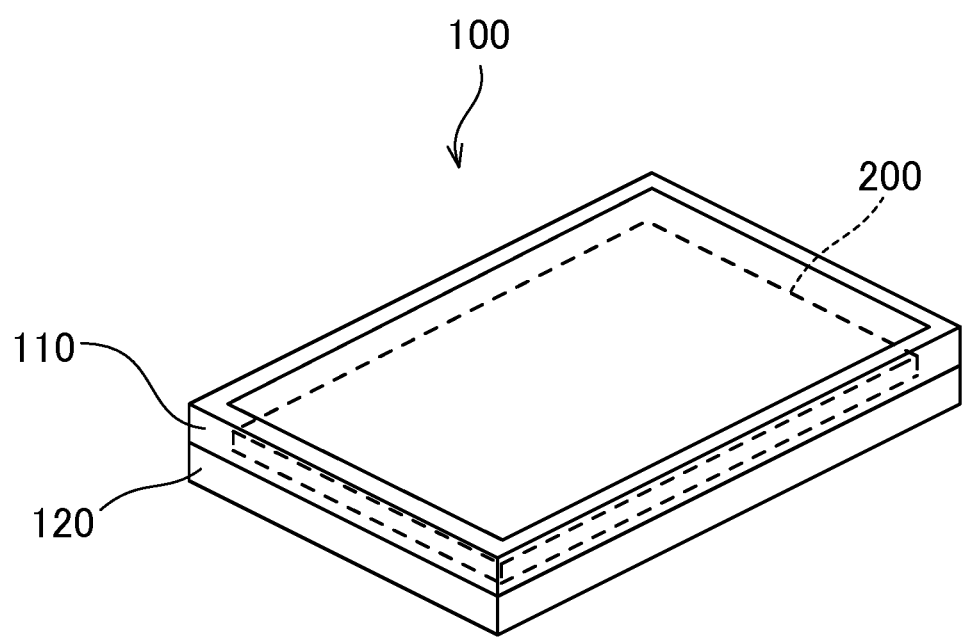
FIG. 1 is a diagram schematically showing an organic EL display device according to an embodiment of the invention.

Hereinafter, an embodiment of the invention will be described with reference to the drawings. In the drawings, the same or equivalent elements are denoted by the same reference numerals and signs, and a redundant description is omitted.

FIG. 1 schematically shows an organic EL display device 100 according to the embodiment of the invention. As shown in the drawing, the organic EL display device 100 is composed of an organic EL panel 200 fixed so as to be interposed between an upper frame 110 and a lower frame 120.

Figure 2:
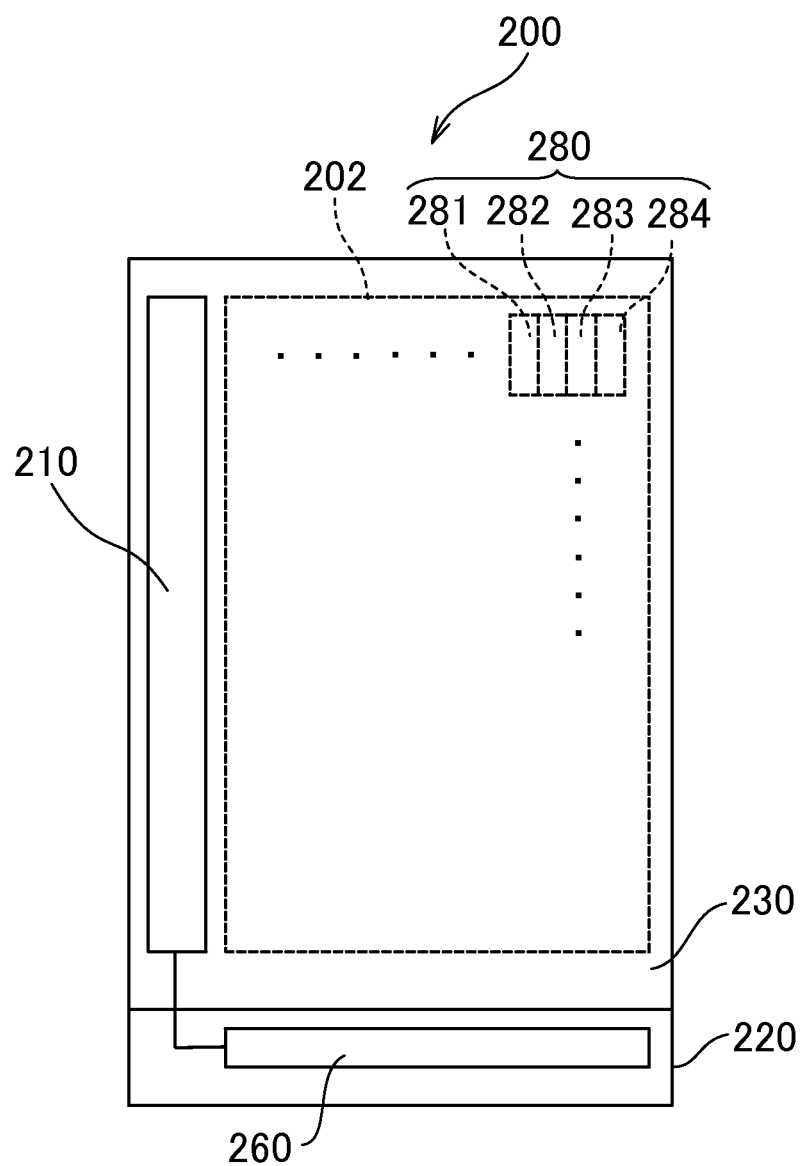
FIG. 2 is a diagram schematically showing the configuration of an organic EL panel in FIG. 1.

FIG. 2 shows the configuration of the organic EL panel 200 in FIG. 1. The organic EL panel 200 includes two substrates, a TFT (Thin Film Transistor) substrate 220 and a color filter substrate 230. A space between the substrates is filled with a transparent resin (not shown). The TFT substrate 220 includes pixels 280 arranged in a matrix in a display region 202. The pixel 280 includes an R sub-pixel 281, a G sub-pixel 282, a B sub-pixel 283, and a W sub-pixel 284 that respectively emit lights in wavelength ranges of colors corresponding to R (red), G (green), B (blue), and W (white). Moreover, the TFT substrate 220 includes a driver circuit 210 and a driver IC (Integrated Circuit) 260. The driver circuit 210 applies, to a scanning signal line (not shown) of a pixel transistor arranged in each of the R sub-pixel 281, the G sub-pixel 282, the B sub-pixel 283, and the W sub-pixel 284, a potential for providing electrical continuity between the source and drain of the pixel transistor. The driver IC 260 applies, to a data signal line of each pixel transistor, a voltage corresponding to the gray-scale value of a pixel, and controls the driver circuit 210.

Figure 3:
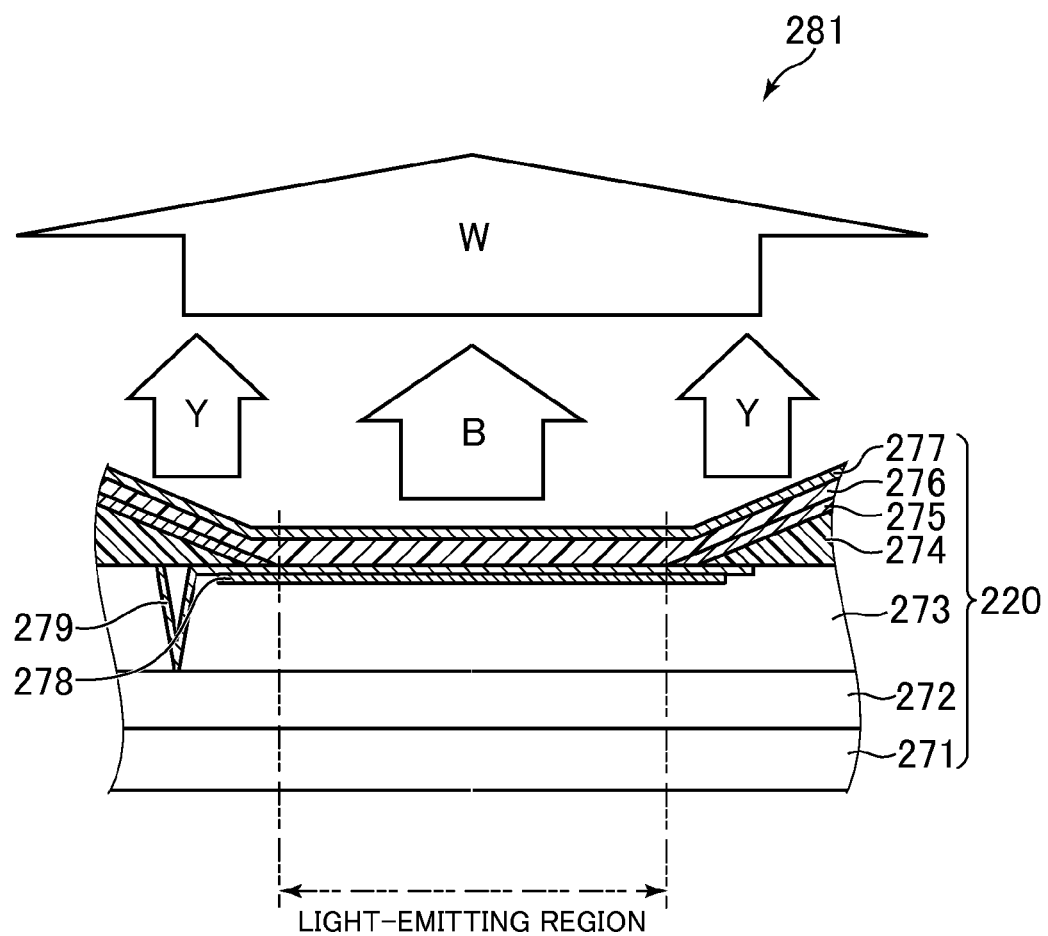
FIG. 3 is a diagram schematically showing a cross-section of an R sub-pixel within a display region of a TFT substrate in FIG. 2.

FIG. 3 is a diagram schematically showing a cross-section of the R sub-pixel 281 of the TFT substrate 220 in FIG. 2. The arrows shown in the drawing schematically show the direction of emitted light and the color of the emitted light for explaining the state of light emission of the R sub-pixel 281 in the TFT substrate 220. The color filter substrate 230 is arranged in the direction indicated by the arrows. As shown in the drawing, the R sub-pixel 281 of the TFT substrate 220 includes: a glass substrate 271 that is an insulating substrate; a TFT circuit layer 272 in which a circuit including a TFT is formed on the glass substrate 271; an inorganic insulating film layer 273 having a through hole that is connected to the circuit of the TFT circuit layer 272; an anode electrode 279 that is electrically connected via the through hole to the circuit of the TFT circuit layer 272 and is one of two electrodes interposing a light-emitting organic layer 276 (described later) therebetween; an insulating bank 274 that is formed of an organic or inorganic insulating material around a light-emitting region, increases in thickness with increasing distance from the light-emitting region, and is formed so as to approach the color filter substrate 230; a fluorescent layer 275 of, for example, yellow (Y) that is formed on the insulating bank 274; the light-emitting organic layer 276 that is continuously formed on the anode electrode 279 and the fluorescent layer 275 and includes a light-emitting layer emitting, for example, blue light and a common layer such as an electron injection layer and a hole transport layer; a cathode electrode 277 that is formed on the entire surface of the display region 202 and is the other of the two electrodes interposing the light-emitting organic layer 276 therebetween; and a reflective layer 278 for reflecting emitted light.

The fluorescent layer 275 that emits Y light may be formed by including a Y fluorescent substance, or the fluorescent layer 275 may emit Y light by including both an R fluorescent substance and a G fluorescent substance. Here, light emission occurs in the light-emitting layer of the light-emitting organic layer 276 between the cathode electrode 277 and a portion of the light-emitting organic layer 276 in contact with the anode electrode 279, and the light-emitting region is defined as a region of the light-emitting portion as viewed in a plan view.

As shown by the arrow in FIG. 3, the light-emitting layer of the light-emitting organic layer 276 emits light in a blue (B) wavelength range at the time of light emission. The light in the blue (B) wavelength range is emitted as it is in the direction of the color filter substrate 230, and also emitted laterally and radiated to the fluorescent layer 275. The fluorescent layer 275 is excited by the radiated light to emit light in a yellow (Y) wavelength range, and the light is emitted in the direction of the color filter substrate 230. Hence, light in a white (W) wavelength range, which is light including the blue (B) and yellow (Y) wavelength ranges, is radiated to the color filter substrate 230 in the R sub-pixel 281. Although the R sub-pixel 281 is shown in FIG. 3, the G sub-pixel 282 and the W sub-pixel 284 also have the same configuration. The B sub-pixel 283 has a configuration obtained by excluding the fluorescent layer 275 from the configuration in FIG. 3.

In the embodiment, therefore, since the light-emitting layer in the TFT substrate 220 is only for blue (B), the manufacturing process can be simplified, and a design can be made with a cavity effect for blue (B) being optimized. Therefore, luminous efficiency can be enhanced.

Figure 4:
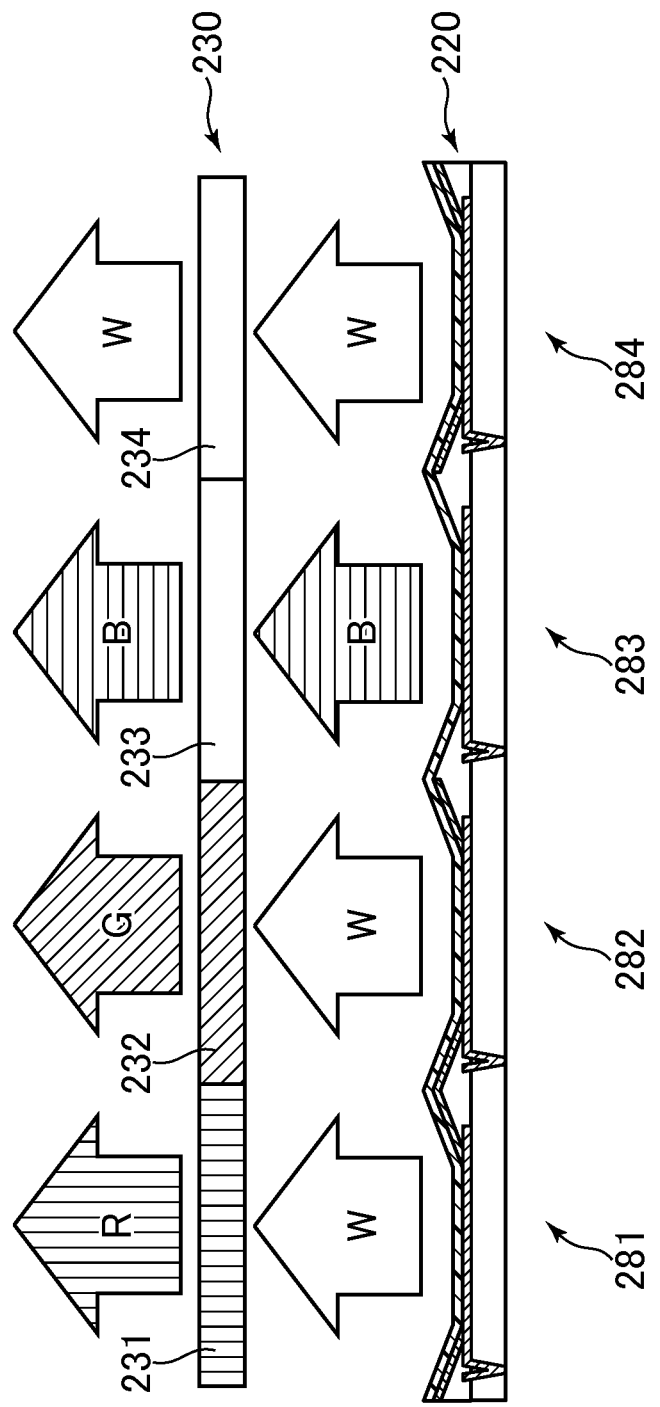
FIG. 4 is a diagram for explaining a wavelength range of light emitted from the TFT substrate and a wavelength range of light transmitting through a color filter substrate in sub-pixels included in one pixel of the organic EL panel.

FIG. 4 is a diagram for explaining the wavelength range of light emitted from the TFT substrate 220 and the wavelength range of light passing through the color filter substrate 230 in the sub-pixels included in one pixel 280 of the organic EL panel 200. As shown in the drawing, the color filter substrate 230 includes: an R color filter 231 that allows only light in an R wavelength range to pass therethrough in the R sub-pixel 281; a G color filter 232 that allows only light in a G wavelength range to pass therethrough in the G sub-pixel 282; a transmitting region 233 that allows lights in all wavelength ranges to pass therethrough in the B sub-pixel 283; and a transmitting region 234 that allows lights in all wavelength ranges to pass therethrough in the W sub-pixel 284. As described above, since the configurations of the R sub-pixel 281, the G sub-pixel 282, and the W sub-pixel 284 are the same in the TFT substrate 220, light in the W wavelength range is emitted from the TFT substrate 220 and radiated to the color filter substrate 230. On the other hand, light in the Y wavelength range does not exist in the B sub-pixel because of the absence of the fluorescent layer 275, so that light in the B wavelength range is radiated as it is to the color filter substrate 230.

As shown by the arrows in FIG. 4, in the R sub-pixel 281, the light in the W wavelength range emitted by the TFT substrate 220 becomes light in the R wavelength range in the R color filter 231, and the light is emitted therethrough. In the G sub-pixel 282, the light in the W wavelength range emitted by the TFT substrate 220 becomes light in the G wavelength range in the G color filter 232, and the light is emitted therethrough. In the B sub-pixel 283, the light in the B wavelength range emitted by the TFT substrate 220 passes as it is through the transmitting region 233 of the color filter substrate 230 and is emitted as the light in the B wavelength range. In the W sub-pixel 284, the light in the W wavelength range emitted by the TFT substrate 220 passes as it is through the transmitting region 234 of the color filter substrate 230 and is emitted as the light in the W wavelength range.

Figure 5:
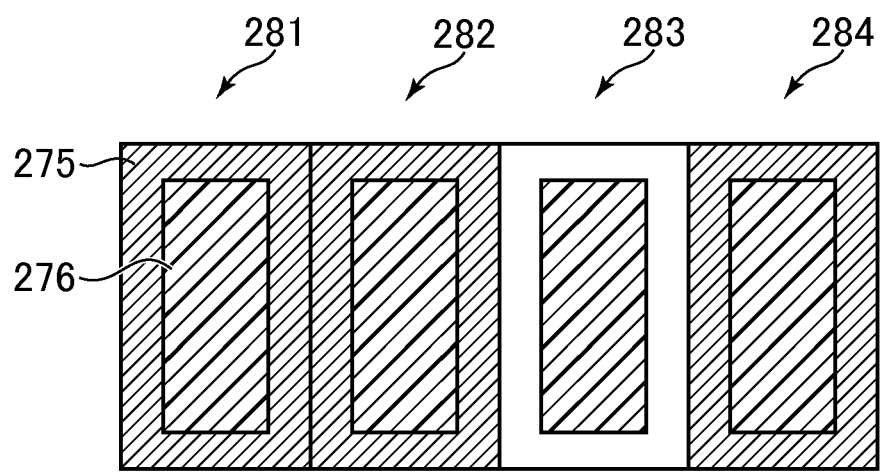
FIG. 5 is a plan view schematically showing coating of a light-emitting organic layer and a fluorescent layer in sub-pixels within a pixel.

FIG. 5 is a plan view schematically showing the arrangement of the light-emitting region of the light-emitting organic layer 276 and the fluorescent layer 275 in the sub-pixels of the pixel 280. As shown in the drawing, the fluorescent layer 275 is formed around the light-emitting region of the light-emitting organic layer 276 in the R sub-pixel 281, the G sub-pixel 282, and the W sub-pixel 284, but the fluorescent layer 275 is not formed around the light-emitting region of the B sub-pixel 283. With this configuration, lights in the B and Y wavelength ranges are emitted in the R sub-pixel 281, the G sub-pixel 282, and the W sub-pixel 284, while light in the B wavelength range is emitted in the B sub-pixel 283. In the embodiment, the fluorescent layer 275 is not formed around the light-emitting region of the B sub-pixel 283, so that the light in the B wavelength range is emitted. However, a configuration may be adopted in which the fluorescent layer 275 is also formed around the light-emitting region of the B sub-pixel 283, and a color filter that allows the light in the B wavelength range to pass therethrough is used in the color filter substrate 230, or a light-shielding film that blocks light at a portion where the fluorescent layer 275 exists is provided to thereby allow only the light in the B wavelength range to pass through the color filter substrate 230.

Figure 6:
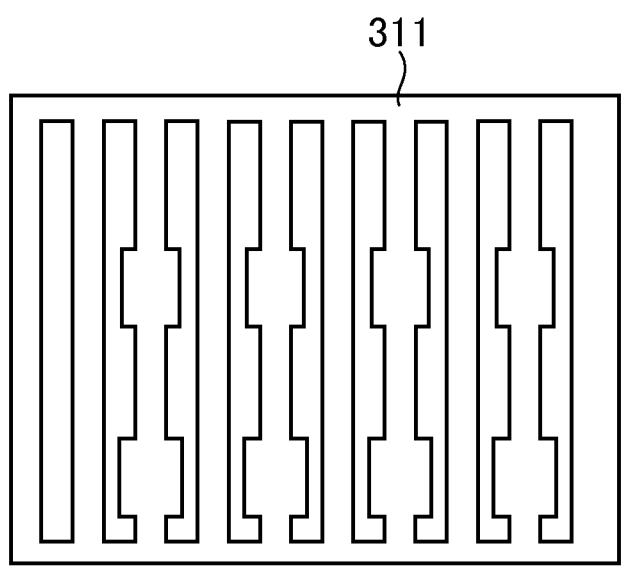
FIG. 6 is a diagram showing an example of a deposition mask for forming the fluorescent layer by deposition.
Figure 7:
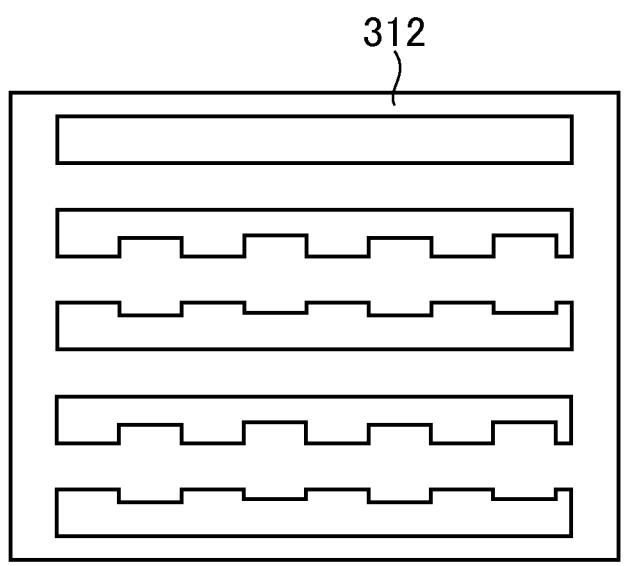
FIG. 7 is a diagram showing an example of a deposition mask for forming the fluorescent layer by deposition.
Figure 8:
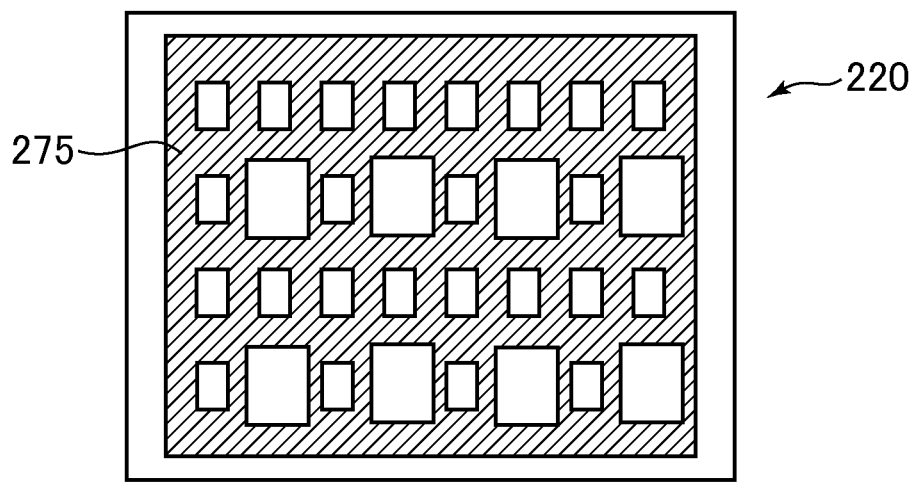
FIG. 8 is a plan view showing a region where the fluorescent layer is formed in the display region.

As a forming method of the fluorescent layer 275, there is a method of forming the fluorescent layer by spin coating on the entire surface of the display region and then removing the fluorescent layer in a light-emitting portion. As a removing method, a water-repellent surface can be provided on the anode electrode 279, or a laser or the like can be used. Moreover, patterning can be performed at a desired place by deposition. FIGS. 6 and 7 are diagrams each showing an example of a deposition mask for forming the fluorescent layer 275 by deposition. As shown in the drawings, a plurality of holes each of which extends in one direction are arranged in parallel and opened in deposition masks 311 and 312. The directions of the plurality of holes opened in the respective deposition masks 311 and 312 are orthogonal to each other. Deposition of the fluorescent layer 275 is performed successively using the deposition masks 311 and 312 in random order. Thus, as shown in FIG. 8, the fluorescent layer 275 can be formed while forming regions that are surrounded by the fluorescent layer 275 and where the fluorescent layer 275 is not deposited.

As has been described above, in the light-emitting element display device of the embodiment, lateral light can also be utilized effectively by emitting in the fluorescent layer. Moreover, since the lateral light is utilized, it is possible to prevent a reduction in display quality caused by mixing with light emitted from other pixels. Further, since the deposition process for forming the light-emitting layer is performed only once, the process can be simplified, higher definition is possible, and the aperture ratio can also be increased. In addition, since the light-emitting layer is used for only one wavelength range, a design can be made in view of a cavity effect by adjusting the optical distance.

Hence, in the light-emitting element display device of the embodiment, the light-emitting element display device can effectively utilize lateral light, make use of a cavity effect, and have high luminous efficiency.

Although, in the embodiment described above, the light-emitting element display device having the four sub-pixels of R, G, B, and W has been described, the embodiment can be applied also to a light-emitting element display device having three sub-pixels of R, G, and B. In this case, a configuration not using the W sub-pixel is adopted.

Although, in the embodiment described above, the B light-emitting layer and the Y fluorescent layer are combined together, a combination of other colors than B and Y may be used. In this case, the light-emitting layer may be composed of plural layers to thereby emit light including a desired wavelength range.

Although, in the embodiment described above, the light-emitting element display device is of a so-called top emission type, the light-emitting element display device may be of a bottom emission type. Moreover, the light-emitting layer is not limited to an organic EL element, but may be other self-luminous type elements that emit light by themselves.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A light-emitting element display device comprising:
a thin film transistor substrate including transistors respectively controlling the amounts of light emission of a plurality of sub-pixels arranged in a display region; and
a color filter substrate arranged to overlap with the thin film transistor substrate and including a color filter allowing light in a predetermined wavelength range to pass therethrough in at least one of the plurality of sub-pixels,
wherein
the thin film transistor substrate comprises
a light-emitting organic layer covering the entire display region and emitting light in respective light-emitting regions in the plurality of sub-pixels,
an insulating bank formed of an insulating material around each of the light-emitting regions, including an inclined surface of the insulating bank coming closer to the color filter substrate as the thickness of the insulating bank increases and the distance from the light-emitting region increases, and
a fluorescent layer directly formed on the inclined surface and excited by light of the light-emitting region to thereby emit light, and
the fluorescent layer is not formed at a center portion of the each of the light-emitting regions.

2. The light-emitting element display device according to claim 1, wherein
the light-emitting organic layer emits light in a blue wavelength range, and
the fluorescent layer emits light in a yellow wavelength range.

3. The light-emitting element display device according to claim 1, wherein
the color filter substrate includes a transmitting region transmitting light in a wavelength range emitted in the thin film transistor substrate.

4. The light-emitting element display device according to claim 3, wherein
the plurality of sub-pixels are sub-pixels emitting lights corresponding to R (red), G (green), B (blue), and W (white) wavelength ranges,
the fluorescent layer is formed only on the inclined surface around the light-emitting region of each of the sub-pixels corresponding to R, G, and W, and the transmitting region of the color filter substrate is formed in the sub-pixels corresponding to B and W.

* * * * *